United States Patent
Kim et al.

(10) Patent No.: US 7,405,600 B2
(45) Date of Patent: Jul. 29, 2008

(54) CURRENT MODE LOGIC-CMOS CONVERTER

(75) Inventors: Yu Sin Kim, Daejeon (KR); Jeong Ho Moon, Daejeon (KR); Moo Il Jeong, Daejeon (KR); Chang Seok Lee, Daejeon (KR); Chang Soo Yang, Seognam (KR); Sang Gyu Park, Suwon (KR); Kwang Du Lee, Damyang (KR)

(73) Assignee: Samsung Electro-Mechanics Co., Ltd., Suwon-Si, Gyunggi-Do (KR)

( * ) Notice: Subject to any disclaimer, the term of this patent is extended or adjusted under 35 U.S.C. 154(b) by 0 days.

(21) Appl. No.: 11/831,348

(22) Filed: Jul. 31, 2007

(65) Prior Publication Data

US 2008/0036496 A1 Feb. 14, 2008

(30) Foreign Application Priority Data

Aug. 9, 2006 (KR) ...................... 10-2006-0075092

(51) Int. Cl.
*H03K 19/0175* (2006.01)
(52) U.S. Cl. ........................................ 326/115; 326/83
(58) Field of Classification Search ............. 326/82–86, 326/112, 115, 66, 68
See application file for complete search history.

(56) References Cited

U.S. PATENT DOCUMENTS

| 4,213,065 | A | 7/1980 | Morcom |
| 5,140,195 | A | 8/1992 | Wakayama |
| 5,825,229 | A | 10/1998 | Manaresi et al. |
| 7,098,699 | B2 * | 8/2006 | Tamura et al. ............... 327/108 |
| 7,224,189 | B1 * | 5/2007 | Ziazadeh et al. .............. 326/86 |
| 2008/0024172 | A1 * | 1/2008 | Yu et al. ..................... 326/115 |

FOREIGN PATENT DOCUMENTS

| JP | 07-312092 A | 11/1995 |
| JP | 09-186564 A | 7/1997 |
| JP | 10-336010 A | 12/1998 |
| KR | 10-2003-0078334 A | 10/2003 |

* cited by examiner

*Primary Examiner*—Don P Le
(74) *Attorney, Agent, or Firm*—Lowe Hauptman Ham & Berner

(57) ABSTRACT

A current mode logic (CML)-CMOS converter comprises an input stage that is turned on/off by receiving an input voltage from the outside; a voltage control unit that outputs a constant voltage; a first switching unit that is connected to the input stage and the voltage control unit and is turned on/off by the constant voltage applied from the voltage control unit; and a second switching unit that is connected to the input stage and is turned on/off by a signal applied from the input stage.

10 Claims, 3 Drawing Sheets

[FIG. 1]
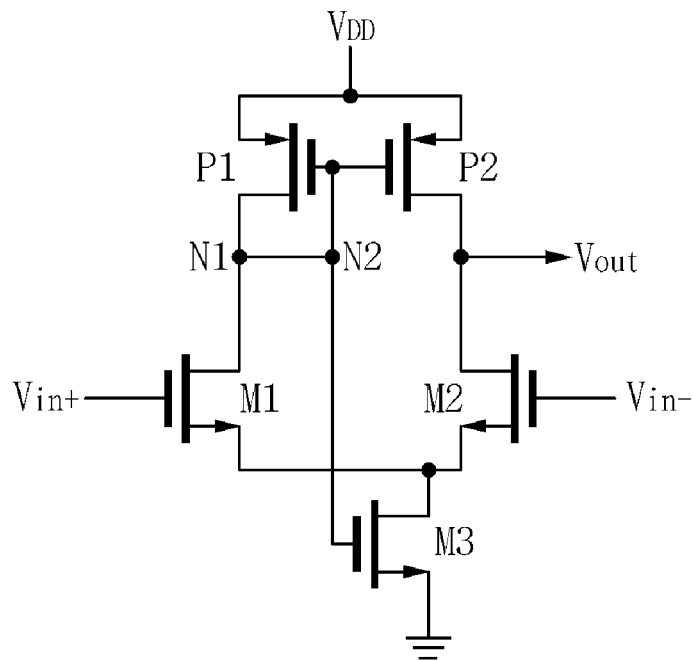
[FIG. 2]
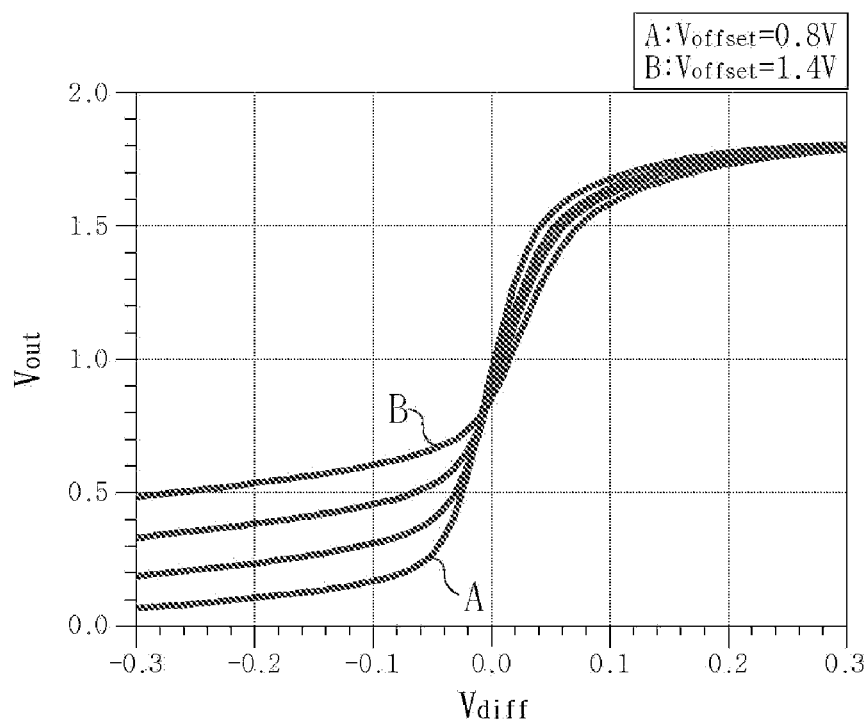

[FIG. 3]
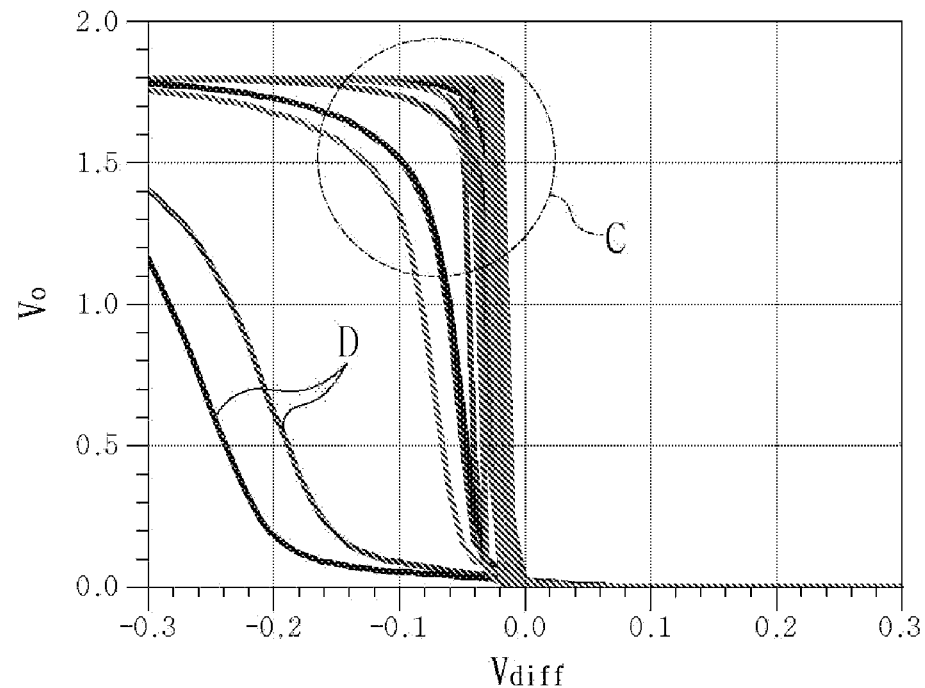
[FIG. 4]
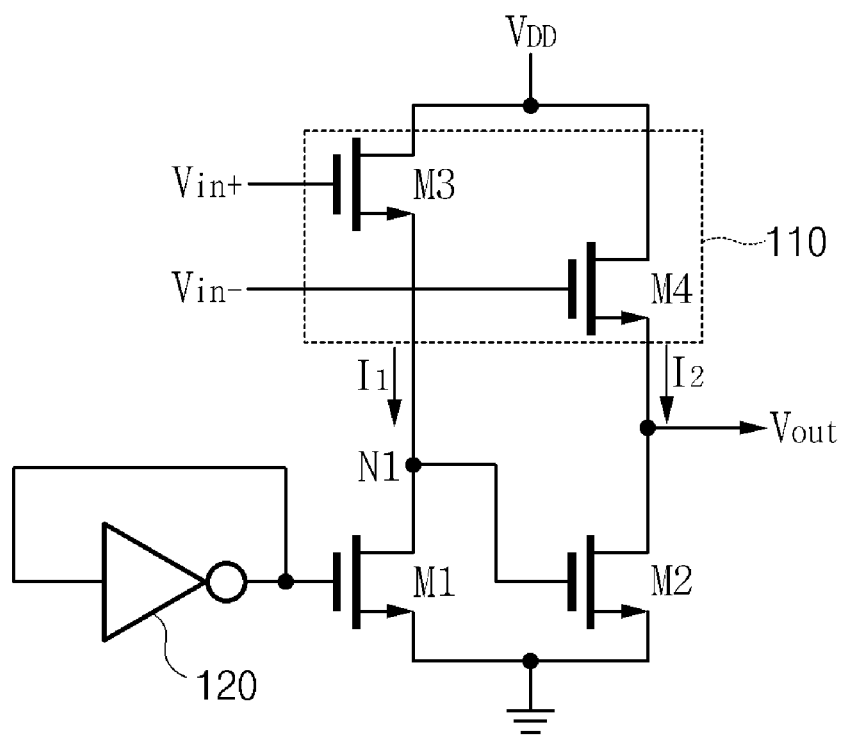

[FIG. 5]
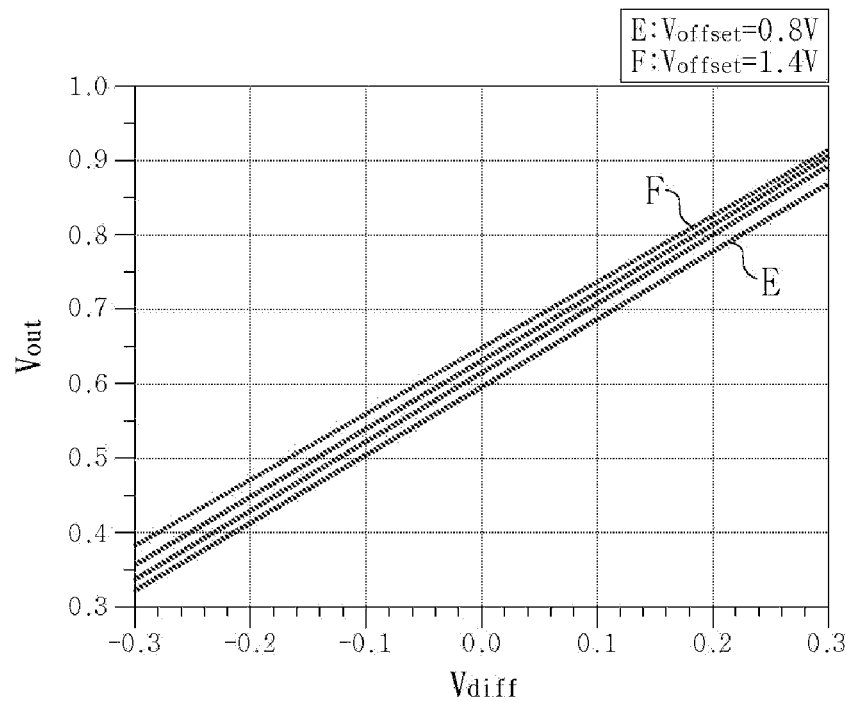
[FIG. 6]
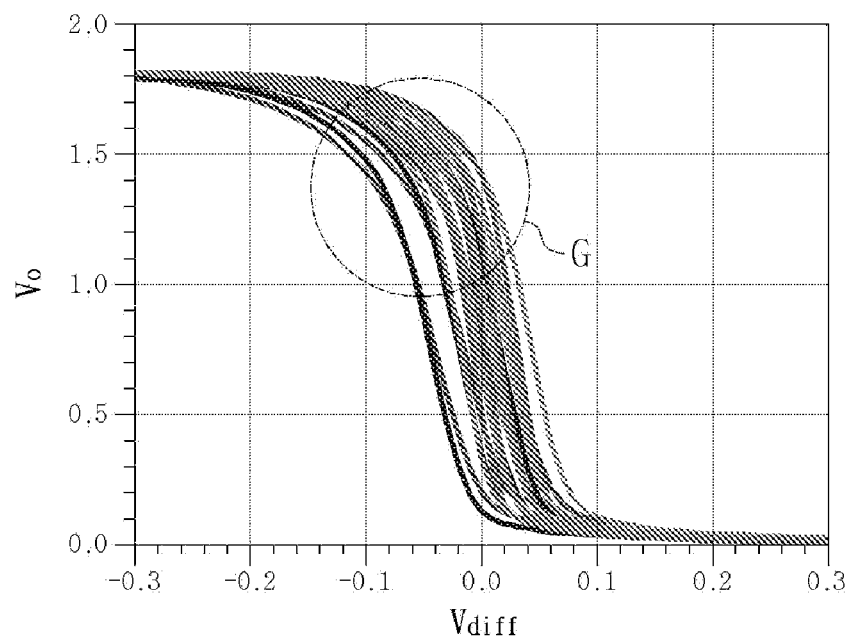

CURRENT MODE LOGIC-CMOS CONVERTER

CROSS-REFERENCE TO RELATED APPLICATIONS

This application claims the benefit of Korean Patent Application No. 10-2006-0075092 filed with the Korea Intellectual Property Office on Aug. 9, 2006, the disclosure of which is incorporated herein by reference.

BACKGROUND OF THE INVENTION

1. Field of the Invention

The present invention relates to a current mode logic (CML)-CMOS converter which can provide a full swing output from a high level to a low level.

2. Description of the Related Art

In general, a transmitter and a receiver are needed for communication. To send information to the receiver, the transmitter transmits a promised code, thereby informing the receiver of a start time point where the information is to be transmitted.

At this time, a Pseudo Noise (PN) code is used as the code for informing of the start time point. A PN generator for generating a PN code is constructed by a switch composed of a D-flip flop. To normally operate such a switch, a high-level or low-level voltage should be applied to the switch. The high-level or low-level voltage applied to the switch is generated by a CML-CMOS converter.

Hereinafter, a conventional CML-CMOS converter will be described in detail with reference to drawings.

FIG. 1 is a circuit diagram of a conventional CML-CMOS converter. FIG. 2 is a graph showing an output voltage of the conventional CML-CMOS converter. FIG. 3 is a graph showing an output voltage of an inverter which is operated by the output voltage of the conventional CML-CMOS converter.

As shown in FIG. 1, the conventional CML-CMOS converter includes a first NMOS transistor M1 which is turned on/off by receiving a DC voltage Voffset and an input voltage Vin+ including a signal component of differential signal through its gate; a second NMOS transistor M2 which is turned on/off by receiving the DC voltage Voffset and an input voltage Vin− including a reverse signal component of differential signal through its gate; a first PMOS transistor P1 of which the gate is connected to the drain of the first NMOS transistor M1, the source receives a power supply voltage $V_{DD}$ applied from the outside, and the drain is connected to the gate; a second PMOS transistor P2 of which the gate is connected to the gate of the first PMOS transistor P1, the source receives the power supply voltage $V_{DD}$, and the drain is connected to the drain of the second NMOS transistor M2; and a third PMOS transistor of which the gate is connected to the gates of the first and second PMOS transistors P1 and P2, the source is grounded, and the drain is connected to the sources of the first and second NMOS transistors M1 and M2.

In the CML-CMOS converter configured in such a manner, when an input voltage Vin+ including a high-level signal component is applied to the gate of the first NMOS transistor M1, the first NMOS transistor M1 is turned on, and a first node N1 which is a junction between the first PMOS transistor P1 and the first NMOS transistor M1 maintains a low level.

A second node N2 which is a junction between the gates of the first and second PMOS transistors P1 and P2 and the first node N1 maintains a low level by the first node N1 having a low level. Further, the first and second PMOS transistors P1 and P2 are turned on by the second node N2 so as to apply the power supply voltage $V_{DD}$ to the drains.

At this time, as the second PMOS transistor P2 is turned on to output the power supply voltage $V_{DD}$, the CML-CMOS converter outputs a high-level power supply voltage $V_{DD}$.

Further, the second NMOS transistor M2 receives an input voltage Vin− including a low-level reverse signal component through its gate and is then turned off. The third NMOS transistor M3, of which the gate is connected to the second node N2, receives a low level signal and is then turned off. Therefore, the output voltage Vout of the CML-CMOS converter is not grounded, but can maintain a high level.

If the second NMOS transistor M2 receives an input voltage Vin− including a high-level reverse signal component, the second NMOS transistor M2 is turned on.

At this time, the first NMOS transistor M1 receives an input voltage Vin+ including a low-level signal component and is then turned off. The first and second nodes N1 and N2 maintain a high level. Accordingly, the first and second PMOS transistor P1 and P2 are turned off to block the DC voltage Voffset.

Further, the second and third NMOS transistors M2 and M3 receive a high-level input voltage Vin− and a voltage of the second node N2 and are then turned on to ground the drain of the second PMOS transistor P2. Thus, the second and third NMOS transistors M2 and M3 output a low-level output voltage Vout.

As described above, the CML-CMOS converter receives, as an input signal, an input voltage Vin+ including a signal component or an input voltage Vin− including a reverse signal component so as to output a high-level or low-level output voltage Vout. Thus, the CML-CMOS converter controls an inverter (not shown) using the output voltage Vout of the CML-CMOS converter as an input voltage.

As shown in FIG. 2, however, the conventional CML-CMOS converter does not always output a high-level or low-level output voltage Vout, but the output voltage may not decrease to a low level of 0V in accordance with process characteristics of NMOS and PMOS transistors composing the CML-CMOS converter.

In FIG. 2, a line A indicates an output voltage Vout when a DC voltage Voffset of an input voltage is 0.8V, and a line B indicates an output voltage Vout when a DC voltage Voffset of an input voltage is 1.4V. In this case, the line A normally changes from a high level (1.8V) to a low level (0V), but the line B changes only to a low level (0.5V, not 0V).

It is preferable that an inverter, which operates using an output voltage Vout of the CML-CMOS converter as an input voltage, normally outputs a high-level or low-level output voltage Vo as indicated by a region C of FIG. 3. However, when a low-level output voltage Vout should be received, and if an output voltage Vout of 0.5V, not 0V, is applied as indicated by the line B of FIG. 2, the inverter outputs an output voltage Vo, which is not a high level, as described by lines D of FIG. 3. Then, the inverter may malfunction.

SUMMARY OF THE INVENTION

An advantage of the present invention is that it provides a CML-CMOS converter that adjusts an output voltage by using the same inverter as an inverter, which operates by receiving the output voltage of the CML-CMOS converter. Then, the CML-CMOS converter can provide a full swing output from a high level to a low level.

Additional aspect and advantages of the present general inventive concept will be set forth in part in the description which follows and, in part, will be obvious from the description, or may be learned by practice of the general inventive concept.

According to an aspect of the invention, a current mode logic (CML)-CMOS converter comprises an input stage that is turned on/off by receiving an input voltage from the outside; a voltage control unit that outputs a constant voltage; a first switching unit that is connected to the input stage and the voltage control unit and is turned on/off by the constant voltage applied from the voltage control unit; and a second switching unit that is connected to the input stage and is turned on/off by a signal applied from the input stage.

Preferably, the input stages includes a third switching unit of which the gate receives a DC voltage and an input voltage including a signal component of a differential signal and the drain receives a power supply voltage, the third switching unit being turned on/off by the input voltage; and a fourth switching unit of which the gate receives the DC voltage and an input voltage including a reverse signal component of a differential signal and the drain receives a power supply voltage, the fourth switching unit being turned on/off by the input voltage.

Preferably, the third and fourth switching units are composed of NMOS transistors.

Preferably, the voltage control unit is an inverter.

Preferably, the inverter has an input terminal connected to an output terminal thereof.

Preferably, the inverter is the same inverter as an inverter which uses an output voltage of the CML-COMS converter as an input voltage.

Preferably, the gate of the first switching unit is connected to the voltage control unit, the drain thereof is connected to the source of the third switching unit, and the source thereof is grounded.

Preferably, the gate of the second switching unit is connected to the source of the third switching unit, the drain thereof is connected to the source of the fourth switching unit, and the source thereof is grounded.

Preferably, the first and second switching units are NMOS transistors.

Preferably, the second switching unit is an NMOS transistor.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which:

FIG. 1 is a circuit diagram of a conventional CML-CMOS converter;

FIG. 2 is a graph showing an output voltage of the conventional CML-CMOS converter;

FIG. 3 is a graph showing an output voltage of an inverter which is operated by the output voltage of the conventional CML-CMOS converter;

FIG. 4 is a circuit diagram simply showing a CML-CMOS converter according to the invention;

FIG. 5 is a graph showing an output voltage of the CML-CMOS converter according to the invention; and FIG. 6 is a graph showing an output voltage of an inverter operated by an output voltage of the CML-CMOS converter according to the invention.

DETAILED DESCRIPTION OF THE PREFERRED EMBODIMENTS

Reference will now be made in detail to the embodiments of the present general inventive concept, examples of which are illustrated in the accompanying drawings, wherein like reference numerals refer to like elements throughout. The embodiments are described below in order to explain the present general inventive concept by referring to the figures.

Hereinafter, a CML-CMOS converter according to the present invention will be described in detail with reference to the accompanying drawings.

FIG. 4 is a circuit diagram simply showing a CML-CMOS converter according to the invention. FIG. 5 is a graph showing an output voltage of the CML-CMOS converter according to the invention. FIG. 6 is a graph showing an output voltage of an inverter operated by an output voltage of the CML-CMOS converter according to the invention.

As shown in FIG. 4, the CML-CMOS converter according to the invention includes an input stage 110 which is turned on/off by receiving an input voltage Vin+ or Vin− applied from the outside; a voltage control unit 120 which outputs a constant voltage, a first switching unit M1 which is connected to the input stage 110 and the voltage control unit 120 and is turned on/off by the constant voltage applied from the voltage control unit 120, and a second switching unit M2 which is connected to the input stage 110 and is turned on/off by a signal applied from the input stage 110.

The input stage 110 includes a third switching unit M3 and a fourth switching unit M4. The gate of the third switching unit M3 receives a DC voltage Voffset applied from the outside and an input voltage Vin+ including a signal component of a differential signal, and the drain thereof receives a power supply voltage $V_{DD}$. The third switching unit M3 is turned on/off by the input voltage Vin+. The gate of the fourth switching unit M4 receives the DC voltage Voffset and an input voltage Vin− including a reverse signal component of a differential signal, and the drain thereof receives a power supply voltage $V_{DD}$. The fourth switching unit M4 is turned on/off by the input voltage Vin−.

Preferably, the third and fourth switching units M3 and M4 are composed of NMOS transistors.

The voltage control unit 120 is composed of the same inverter as an inverter (not shown) which uses an output voltage Vout of the CML-CMOS converter as an input voltage. An output terminal of the voltage control unit 120 is connected to an input terminal thereof such that an output signal is fed back. Therefore, the voltage control unit 120 always outputs a threshold voltage of an inverter having a constant voltage.

The gate of the first switching unit M1 is connected to the output terminal of the voltage control unit 120, the drain thereof is connected to the source of the third switching unit M3, and the source thereof is grounded. The first switching unit M1 is turned on by the constant voltage applied from the voltage control unit 110 so as to ground the power supply voltage $V_{DD}$.

The gate of the second switching unit M2 is connected to the source of the third switching unit M3, the drain thereof is connected to the source of the fourth switching unit M4, and the source thereof is grounded. The second switching unit M2 is turned on/off by a signal output from the third switching unit M3.

Preferably, the first and second switching units M1 and M2 are composed of NMOS transistors.

Meanwhile, it has been described, for convenience of explanation, that NMOS transistors are used as the first to fourth switching units M1 to M4. Without being limited thereto, PMOS transistors or a combination of NMOS transistors and PMOS transistors can be used.

Hereinafter, the operation of the CML-CMOS converter configured in such a manner will be described as follows. When an input voltage Vin+ including a signal component of a differential signal with a high level is applied to the gate of the third switching unit M3, the switching unit M3 is turned on to apply the power supply voltage $V_{DD}$, from which a gate-source voltage $V_{GS3}$ of the third switching unit M3 is subtracted, to the source.

Further, when a threshold voltage of the voltage control unit 120 is applied from the voltage control unit 120, the first switching unit M1 is turned on to ground a power supply voltage $V_{DD}$ applied through the third switching unit M3. The gate-source voltage $V_{GS1}$ of the first switching unit M1 can be expressed by Equation 1.

$$V_{GS1}=V_t \quad \text{[Equation 1]}$$

As for the inverter inv, the same element as an inverter, which operates using an output voltage of the CML-CMOS converter as an input voltage, is used. An output terminal of the inverter inv is connected to an input terminal thereof so as to output a threshold voltage of the inverter inv at all times.

A current flowing in the first NMOS transistor M1 and a current flowing in the third NMOS transistor M3 are the same as each other (a first current $I_1$). Therefore, the gate-source voltage $V_{GS1}$ of the first NMOS transistor M1 is the same as the gate-source voltage $V_{GS3}$ of the third NMOS transistor M3. Accordingly, the gate-source voltage $V_{GS1}$ of the first NMOS transistor M1 can be expressed by Equation 2.

$$V_{GS3}=V_{GS1}=V_t \quad \text{[Equation 2]}$$

The fourth switching unit M4 receives an input voltage Vin− including a reverse signal component of a differential signal with a low level, through the gate thereof, and is then turned off.

The second switching unit M2, of which the gate is connected to a node N1 as a junction between the source of the third switching unit M3 and the first switching unit M1, is turned on by a power supply voltage $V_{DD}$ applied through the third switching unit M3 so as to ground the output voltage Vout to output.

At this time, a voltage applied to the gate of the second switching unit M2 is the power supply voltage $V_{DD}$ from which the gate-source voltage $V_{GS3}$ of the third switching unit M3 is subtracted.

Therefore, the gate-source voltage $V_{GS2}$ of the second switching unit M2 can be expressed by Equation 3.

$$V_{GS2}=V_{in+}-V_{GS3}=V_{in+}-V_t \quad \text{[Equation 3]}$$

The output voltage Vout output through the fourth switching unit M4 is a voltage obtained by subtracting the gate-source voltage $V_{GS4}$ of the fourth switching unit M4 from the input voltage Vin− applied to the gate of the fourth switching unit M4. The output voltage Vout can be expressed by Equation 4.

$$V_{out}=V_{in-}-V_{GS4}=V_{in-}-V_{GS2}=-(V_{in+}-V_{in-})+V_t \quad \text{[Equation 4]}$$

As expressed by Equation 4, it can be found that the output voltage Vout of the CML-CMOS converter according to the invention can be determined by the calculation expression of input voltages Vin+ and Vin− and a constant voltage of the voltage control unit 120.

As shown in FIG. 5, the CML-CMOS converter does not change an output voltage from 0.0V to 1.8V to output, but outputs an output voltage larger or smaller than a threshold voltage of an inverter in accordance with the input voltage Vin+ or Vin− applied to the gate of the third or fourth switching unit M3 or M4, the inverter operating using the output voltage of the CML-COMS converter as an input voltage. Then, an output voltage output from the inverter can maintain a high or low level.

For example, when it is assumed that a DC voltage Voffset is 0.8V and a signal component and a reverse signal component change from 0V to ±0.3V as indicated by a line E of FIG. 5, and if the input voltages Vin+ and Vin− are respectively applied at a point of time where the signal component is +0.1V and the reverse signal component is −0.1V, an output voltage Vout of 0.4 is output in case where a differential signal Vdiff of FIG. 5 is −0.2V (Vout=−(0.9−0.7)+0.6=0.4).

At this time, the inverter receiving the output voltage Vout of 0.4V, which is lower than its threshold voltage of 0.6V, judges that a low-level signal is applied and then outputs a high-level output voltage.

Further, if the input voltages Vin+ and Vin− are respectively applied at a point of time where the signal component is −0.1 V and the reverse signal component is 0.1V, an output voltage Vout of 0.8 V is output in case where a differential signal Vdiff of FIG. 5 is 0.2V (Vout=−(0.7−0.9)+0.6=0.8V).

Accordingly, the inverter receiving the output voltage Vout of 0.8V, which is higher than its threshold voltage of 0.6V, judges that a high-level signal is applied and then outputs a low-level output voltage.

That is, as shown in FIG. 6, the inverter using an output voltage Vout of the CML-CMOS converter as an input voltage does not malfunction like D of FIG. 3 and can always output a high- or low-level output voltage Vo, even though a process characteristic changes.

According to the CML-CMOS converter of the invention, the same inverter as an inverter which operates by receiving an output voltage of the CML-CMOS converter is used so that the CML-CMOS converter outputs an output voltage smaller or larger than the threshold voltage of the inverter. Therefore, it is possible to provide a full swing output from a high level to a low level.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A current mode logic (CML)-CMOS converter comprising:
   an input stage that is turned on/off by receiving an input voltage from the outside;
   a voltage control unit that outputs a constant voltage;
   a first switching unit that is connected to the input stage and the voltage control unit and is turned on/off by the constant voltage applied from the voltage control unit; and
   a second switching unit that is connected to the input stage and is turned on/off by a signal applied from the input stage.

2. The CML-CMOS converter according to claim 1, wherein the input stages includes:
   a third switching unit of which the gate receives a DC voltage and an input voltage including a signal component of a differential signal and the drain receives a power supply voltage, the third switching unit being turned on/off by the input voltage; and a fourth switching unit of which the gate receives the DC voltage and an input voltage including a reverse signal component of a differential signal and the drain receives a power supply voltage, the fourth switching unit being turned on/off by the input voltage.

3. The CML-CMOS converter according to claim 1, wherein the third and fourth switching units are composed of NMOS transistors.

4. The CML-CMOS converter according to claim 1, wherein the voltage control unit is an inverter.

5. The CML-CMOS converter according to claim 4, wherein the inverter has an input terminal connected to an output terminal thereof.

6. The CML-CMOS converter according to claim 5, wherein the inverter is the same inverter as an inverter which uses an output voltage of the CML-COMS converter as an input voltage.

7. The CML-CMOS converter according to claim 2, wherein the gate of the first switching unit is connected to the voltage control unit, the drain thereof is connected to the source of the third switching unit, and the source thereof is grounded.

8. The CML-CMOS converter according to claim 2, wherein the gate of the second switching unit is connected to the source of the third switching unit, the drain thereof is connected to the source of the fourth switching unit, and the source thereof is grounded.

9. The CML-CMOS converter according to claim 7, wherein the first switching unit is an NMOS transistor.

10. The CML-CMOS converter according to claim 8, wherein the second switching unit is an NMOS transistor.

* * * * *